United States Patent
Qi et al.

(10) Patent No.: US 10,199,495 B2
(45) Date of Patent: Feb. 5, 2019

(54) LATERALLY DIFFUSED METAL-OXIDE SEMICONDUCTOR FIELD-EFFECT TRANSISTOR

(71) Applicant: CSMC TECHNOLOGIES FAB2 CO., LTD., Wuxi New District, Jiangsu (CN)

(72) Inventors: Shukun Qi, Jiangsu (CN); Guipeng Sun, Jiangsu (CN)

(73) Assignee: CSMC TECHNOLOGIES FAB2 CO., LTD., Wuxi New District, Jiang (CN)

( * ) Notice: Subject to any disclaimer, the term of this patent is extended or adjusted under 35 U.S.C. 154(b) by 0 days.

(21) Appl. No.: 15/766,082

(22) PCT Filed: Aug. 18, 2016

(86) PCT No.: PCT/CN2016/095902
§ 371 (c)(1),
(2) Date: Apr. 5, 2018

(87) PCT Pub. No.: WO2017/059739
PCT Pub. Date: Apr. 13, 2017

(65) Prior Publication Data
US 2018/0286976 A1      Oct. 4, 2018

(30) Foreign Application Priority Data
Oct. 8, 2015   (CN) .......................... 2015 1 0647166

(51) Int. Cl.
*H01L 29/76*      (2006.01)
*H01L 29/94*      (2006.01)
(Continued)

(52) U.S. Cl.
CPC ........ *H01L 29/7816* (2013.01); *H01L 29/063* (2013.01); *H01L 29/0882* (2013.01); *H01L 29/7833* (2013.01); *H01L 29/0692* (2013.01)

(58) Field of Classification Search
None
See application file for complete search history.

(56) References Cited

U.S. PATENT DOCUMENTS

| 2009/0294849 A1 | 12/2009 | Min et al. |
| 2011/0057263 A1* | 3/2011 | Tang .................. H01L 29/1037 257/339 |

(Continued)

FOREIGN PATENT DOCUMENTS

| CN | 1632931 A | 6/2005 |
| CN | 102403350 A | 4/2012 |

(Continued)

OTHER PUBLICATIONS

International Search Report with English Translation dated Nov. 23, 2016 issued in corresponding International Application No. PCT/CN2016/095902, pp. 1-8.

*Primary Examiner* — Thien F Tran
(74) *Attorney, Agent, or Firm* — Polsinelli PC

(57) ABSTRACT

A laterally diffused metal-oxide semiconductor field-effect transistor, comprising a substrate, a first conductivity type well region, a second conductivity type well region, a drain electrode in the first conductivity type well region, a source electrode and a body region in the second conductivity type well region, and a gate electrode arranged across surfaces of the first conductivity type well region and the second conductivity type well region, and also comprising a floating layer ring arranged on the top of the first conductivity type well region and located between the gate electrode and the drain electrode and a plurality of groove polysilicon electrodes running through the floating layer ring and stretching into the first conductivity type well region.

9 Claims, 1 Drawing Sheet

(51) Int. Cl.
    *H01L 31/062*     (2012.01)
    *H01L 31/113*     (2006.01)
    *H01L 31/119*     (2006.01)
    *H01L 29/78*     (2006.01)
    *H01L 29/08*     (2006.01)
    *H01L 29/06*     (2006.01)

(56) References Cited

U.S. PATENT DOCUMENTS

2011/0127602 A1*   6/2011   Mallikarjunaswamy .................... H01L 21/82380 257/331
2011/0241114 A1*  10/2011   Su ....................... H01L 29/0634 257/343
2013/0069712 A1    3/2013   Trajkovic et al.

FOREIGN PATENT DOCUMENTS

CN     103441145 A    12/2013
CN     103515439 A    1/2014

* cited by examiner

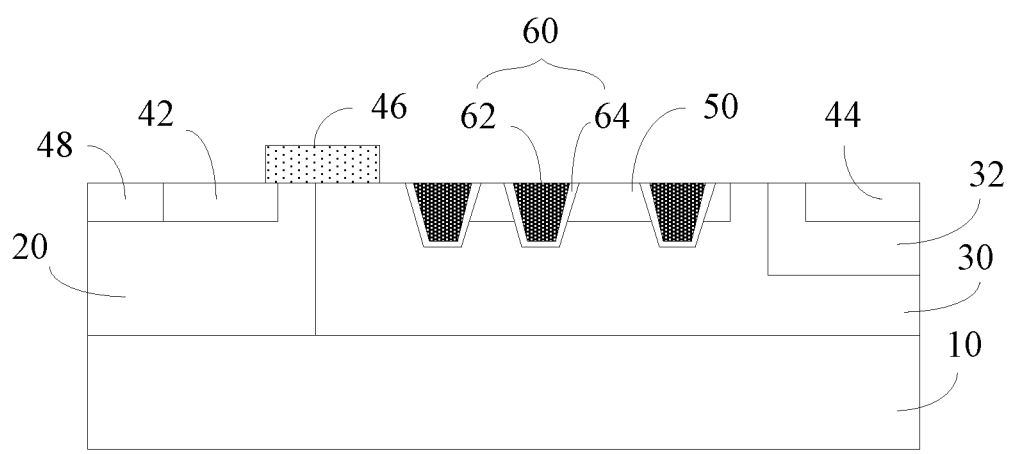

LATERALLY DIFFUSED METAL-OXIDE SEMICONDUCTOR FIELD-EFFECT TRANSISTOR

CROSS REFERENCE TO RELATED APPLICATION

This application claims priority to Chinese Patent Application No. 201510647166.7, entitled "LATERALLY DIFFUSED METAL-OXIDE SEMICONDUCTOR FIELD-EFFECT TRANSISTOR HAVING RESURF STRUCTURE" filed on Oct. 8, 2015, the contents of which are expressly incorporated by reference herein in its entirety.

TECHNICAL FIELD

The present disclosure relates to semiconductor technologies, and more particularly relates to a laterally diffused metal-oxide-semiconductor field-effect transistor having a RESURF (reduced surface field) structure.

BACKGROUND

The basic structure of a laterally diffused metal-oxide-semiconductor field-effect transistor using RESURF (reduced surface field) principle consists of a low-doped P-type substrate and a low-doped N-type epitaxial layer. A P well is formed on the epitaxial layer and N+, P+ impurities are implanted into the P well, such that a transverse P-well/N-epi junction and a longitudinal P-sub/N-epi junction are formed. Due to a higher doping concentration at both ends of the transverse junction, the breakdown voltage of the transverse junction is lower than that of the longitudinal junction. The basic principle of RESURF is to enable the epitaxial layer to be completely depleted before the transverse junction reaches the critical avalanche breakdown field by using the interaction of the transverse junction and the longitudinal junction. By reasonably optimizing the device parameters, the breakdown of the device occurs in the longitudinal junction, thereby playing a role in reducing the surface field.

By adjusting the concentrations of N-type and P-type impurities of a drift region to meet RESURF requirements, the conventional RESURF structure achieves a required withstand voltage. In addition, on-resistance is required to be as small as possible to reduce switching losses. A laterally diffused metal-oxide-semiconductor field-effect transistor (LDMOSFET) having the conventional RESURF structure is provided with a floating P-type ring in the drift region. In a switching process of the device, since the floating P-type ring cannot release the minority carrier charges generated in the previous switching cycle in time, the charge accumulation effect in the next cycle easily leads to a higher gate-drain capacitance (Cgd) and poor dynamic characteristics of the device.

SUMMARY

Accordingly, in view of the problems of higher Cgd and poor dynamic characteristics of a conventional RESURF structure having a floating P-type ring, it is necessary to provide a laterally diffused metal-oxide-semiconductor field-effect transistor having a RESURF structure.

A laterally diffused metal-oxide-semiconductor field-effect transistor includes a substrate, a first-conductivity type well region, a second-conductivity type well region. The first-conductivity type and the second-conductivity type are opposite conductivity types. The laterally diffused metal-oxide-semiconductor field-effect transistor further includes a drain located in the first-conductivity type well region, a source located in the second-conductivity type well region, a gate spanning surfaces of the first-conductivity type well region and the second-conductivity type well region, a floating ring disposed in top of the first-conductivity type well region and located between the gate and the drain, and a plurality of trench polysilicon electrodes. Each of the trench polysilicon electrodes extends through the floating ring and into the first-conductivity type well region.

In the aforementioned laterally diffused metal-oxide-semiconductor field-effect transistor, the trench polysilicon electrode is disposed in the floating ring, such that the potential of the floating ring is relatively stable due to the capacitive coupling of the trench polysilicon electrode. In addition, the gate-drain capacitance Cgd is reduced, which helps to improve the dynamic characteristics of the device.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

FIG. 1 is a cross-sectional view of a laterally diffused metal-oxide-semiconductor field-effect transistor according to one embodiment.

DETAILED DESCRIPTION OF THE EMBODIMENTS

Embodiments of the invention are described more fully hereinafter with reference to the accompanying drawings. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. The term "and/or" as used herein includes any and all combinations of one or more of the associated listed items.

The semiconductor vocabularies used herein is a technical term commonly used by those skilled in the art. For example, with respect to P-type and N-type impurities, in order to distinguish the doping concentration, a P+ type simply represents a P-type with heavily doped concentration, a P type represents a P-type with medium doped concentration, and a P− type represents a P-type with lightly doped concentration. An N+ type represents an N-type with heavily doped concentration, an N type represents an N-type with medium doped concentration, and an N− type represents an N-type with lightly doped concentration.

FIG. 1 is a cross-sectional view of a laterally diffused metal-oxide-semiconductor field-effect transistor according to one embodiment. In the illustrated embodiment, an N-type is defined as a first-conductivity type, and a P-type is defined as a second-conductivity type. Correspondingly, the laterally diffused metal-oxide-semiconductor field-effect transistor (LDMOS) includes a P-type substrate 10, a P well 20 (i.e., a second-conductivity type well region) on the P-type substrate 10, an N well 30 (i.e., a first-conductivity type well region) as a drift region, a shallow well 32 (also N well) in the N well 30, an N+ drain 44 disposed in the shallow well 32, an N+ source 42 disposed in the P well 20, and a P+ body region 48 in P well 20, a gate 46 disposed on a surface of a junction between the P well 20 and N well 30. The laterally diffused metal-oxide-semiconductor field-effect transistor further includes a floating P-type ring 50 disposed in top of the N well 30 and located between the gate 46 and the shallow well 32, and a plurality of trench polysilicon electrodes 60 extending through the floating P-type ring 50 and into the N well 30. The trench polysilicon electrode 60 includes a silicon oxide outer wall 64 and polysilicon 62 filled in the silicon oxide outer wall 64.

In the aforementioned laterally diffused metal-oxide-semiconductor field-effect transistor having a RESURF structure, the trench polysilicon electrode 60 is disposed in the floating P-type ring 50, such that the potential of the floating P-type ring 50 is relatively stable due to the capacitive coupling of the trench polysilicon electrode 60. In addition, the gate-drain capacitance Cgd is reduced, which helps to improve the dynamic characteristics of the device.

In one embodiment, the trench polysilicon electrode 60 includes a silicon oxide outer wall 64 and polysilicon 62 filled in the silicon oxide outer wall 64. Due to the material property of the silicon oxide outer wall 64, its critical electric field becomes higher (three times higher than the electric field in silicon), the influence of an additional electric field introduced by the floating P-type ring 50 on the total electric field of the device is weakened, and the withstand voltage of the device is improved.

In one embodiment, a plurality of trench polysilicon electrodes 60 adjacent to the gate 46 are electrically coupled to the gate 46. This is equivalent to increasing the majority carrier concentration in the JFET region when the device is in an on-state, which helps to reduce the on-resistance Rsp of the device.

In one embodiment, the trench polysilicon electrodes 60 other than the trench polysilicon electrodes 60 electrically coupled to the gate 46 remain still in a floating state and are not electrically coupled to the gate. When the device is in an off-state, the gate 46 of the device along with the source 42 will be grounded (the drain 44 is at a high potential). At this time, the trench polysilicon electrodes 60 electrically coupled to the gate 46 are grounded, such that the hole concentration can be increased, which is helpful to deplete the N well 30. Therefore, the doping concentration of the N well 30 can be appropriately increased during manufacture, and the on-resistance Rsp can be further reduced.

Although the description is illustrated and described herein with reference to certain embodiments, the description is not intended to be limited to the details shown. Modifications may be made in the details within the scope and range equivalents of the claims.

What is claimed is:

1. A laterally diffused metal-oxide-semiconductor field-effect transistor, comprising:
   a substrate;
   a first-conductivity type well region;
   a second-conductivity type well region; the first-conductivity type and the second-conductivity type being opposite conductivity types;
   a drain located in the first-conductivity type well region;
   a source located in the second-conductivity type well region;
   a gate spanning surfaces of the first-conductivity type well region and the second-conductivity type well region;
   a floating ring disposed in top of the first-conductivity type well region and located between the gate and the drain; and
   a plurality of trench polysilicon electrodes, each of the trench polysilicon electrodes extending through the floating ring and into the first-conductivity type well region.

2. The laterally diffused metal-oxide-semiconductor field-effect transistor according to claim 1, wherein the first-conductivity type well region further comprises a shallow well disposed therein, the drain is disposed in the shallow well, the floating ring is disposed between the shallow well and the gate.

3. The laterally diffused metal-oxide-semiconductor field-effect transistor according to claim 1, wherein at least one trench polysilicon electrode adjacent to the gate is electrically coupled to the gate.

4. The laterally diffused metal-oxide-semiconductor field-effect transistor according to claim 3, wherein the trench polysilicon electrodes other than the trench polysilicon electrode electrically coupled to the gate remain in a floating state and are not electrically coupled to the gate.

5. The laterally diffused metal-oxide-semiconductor field-effect transistor according to claim 1, wherein the first-conductivity type is N-type, the second-conductivity type is P-type, the drain is an N+ drain, the source is an N+ source, the floating ring is a floating P-type ring.

6. The laterally diffused metal-oxide-semiconductor field-effect transistor according to claim 1, further comprising a body region located in the second-conductivity type well region.

7. The laterally diffused metal-oxide-semiconductor field-effect transistor according to claim 6, wherein the first-conductivity type is N-type, the second-conductivity type is P-type, the drain is an N+ drain, the source is an N+ source, the floating ring is a floating P-type ring, the body region is a P+ body region.

8. The laterally diffused metal-oxide-semiconductor field-effect transistor according to claim 6, wherein the body region is disposed on a side of the source away from the gate.

9. The laterally diffused metal-oxide-semiconductor field-effect transistor according to claim 1, wherein each of the trench polysilicon electrodes comprises a silicon oxide outer wall and polysilicon filled in the silicon oxide outer wall.

* * * * *